US009985090B2

(12) United States Patent
Kakefu

(10) Patent No.: US 9,985,090 B2
(45) Date of Patent: May 29, 2018

(54) SEMICONDUCTOR DEVICE WITH LOW LIFETIME REGION

(71) Applicant: FUJI ELECTRIC CO., LTD., Kawasaki-shi (JP)

(72) Inventor: Mitsuhiro Kakefu, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 14/103,289

(22) Filed: Dec. 11, 2013

(65) Prior Publication Data
US 2014/0159192 A1    Jun. 12, 2014

(30) Foreign Application Priority Data

Dec. 12, 2012  (JP) .................................. 2012-271031
Nov. 7, 2013  (JP) .................................. 2013-230902

(51) Int. Cl.
*H01L 29/06*     (2006.01)
*H01L 29/32*     (2006.01)
*H01L 29/861*    (2006.01)

(52) U.S. Cl.
CPC .......... *H01L 29/0619* (2013.01); *H01L 29/32* (2013.01); *H01L 29/8611* (2013.01); *H01L 29/0692* (2013.01)

(58) Field of Classification Search
CPC . H01L 29/0619; H01L 29/0692; H01L 29/32; H01L 29/8611
USPC ....................................................... 257/494
See application file for complete search history.

(56) References Cited

U.S. PATENT DOCUMENTS

| 6,031,276 A | 2/2000 | Osawa et al. |
| 6,168,981 B1* | 1/2001 | Battaglia ............... H01L 21/221 257/E21.137 |
| 6,870,199 B1* | 3/2005 | Yoshikawa ........... H01L 21/263 257/131 |
| 2005/0263842 A1 | 12/2005 | Matsui et al. |
| 2008/0246096 A1* | 10/2008 | Sakakibara ......... H01L 29/0634 257/401 |

(Continued)

FOREIGN PATENT DOCUMENTS

| EP | 0878849 A2 | 11/1998 |
| JP | H09-246570 A | 9/1997 |

(Continued)

*Primary Examiner* — Stephen Bradley
*Assistant Examiner* — Patricia Reddington
(74) *Attorney, Agent, or Firm* — Rabin & Berdo, P.C.

(57) ABSTRACT

In a semiconductor device including a low lifetime region of a depth within a range on both sides sandwiching a p-n junction of a p-type semiconductor region bottom portion, the low lifetime region includes a central region that has a portion coinciding with the semiconductor region as seen from one main surface side and is selectively formed as far as the position of a contact end portion of a region of the coinciding portion with which the semiconductor region and a metal electrode are in contact, a peripheral region wherein the central region extends as far as the position of an outer peripheral end of the semiconductor region, and an expanded end portion region wherein the peripheral region extends as far as an outer peripheral end of the innermost of guard rings. Because of this, it is possible to reduce leakage current while maintaining high reverse recovery current resistance.

16 Claims, 16 Drawing Sheets

(56) References Cited

U.S. PATENT DOCUMENTS

2010/0019342 A1* 1/2010 Kawano ............. H01L 29/0619
257/494
2011/0147829 A1* 6/2011 Nakajima ........... H01L 29/0634
257/329

FOREIGN PATENT DOCUMENTS

| JP | H10-178019 A | 6/1998 |
| --- | --- | --- |
| JP | H1168123 A | 3/1999 |
| JP | 2000-114550 A | 4/2000 |
| JP | 2000-332263 A | 11/2000 |
| JP | 2001-135831 A | 5/2001 |
| JP | 2005-340528 A | 12/2005 |
| JP | 2010-050441 A | 3/2010 |

* cited by examiner

SEMICONDUCTOR DEVICE WITH LOW LIFETIME REGION

BACKGROUND OF THE INVENTION

1. Field of the Invention

The present invention relates to a semiconductor device such as a freewheeling diode or converting diode, mounted together with a switching device in a power conversion device, and used for reflux when the switching device is inhibited.

2. Description of the Background Art

A diode is such that, even when the applied voltage polarity is changed from forward to reverse, reverse current flows for a while rather than the current being immediately cut off. This is because a current generated by an excess of electron-hole carriers including minority carriers implanted from a p-type anode region via a p-n junction into an n-type drift layer, and accumulated, when there is forward bias being ejected into the exterior of the semiconductor substrate (an anode electrode and a cathode electrode) when there is reverse bias becomes a reverse current flowing from the cathode side to the anode side. This reverse current is called the diode recovery current (reverse recovery current).

When the diode carries out high speed switching, it is necessary to increase the forward current attenuation rate (di/dt) when switching from a forward bias to a reverse bias. However, when the forward current attenuation rate (di/dt) becomes excessive, it may happen that the diode is destroyed. This is because when there is reverse bias (the anode electrode has negative polarity), carriers (holes) accumulated on the outer peripheral side of the anode region are ejected, because of which a reverse recovery current with high di/dt concentrates in a termination portion, particularly in a corner portion edge, of the anode electrode.

Meanwhile, for a diode used for high speed switching, it is desirable that the value of di/dt resistance, which is the value of the forward current attenuation rate (di/dt) when reaching the destruction, is high. In order to increase the di/dt resistance, it is necessary to suppress as far as possible a concentration of reverse recovery current liable to occur in the vicinity of the outer peripheral end of the anode electrode or anode region when reverse voltage is applied, thereby increasing the reverse recovery current resistance.

As away of doing so, there is publicly known technology whereby recovery resistance (reverse recovery current resistance) is increased by the reverse recovery current being reduced by a low lifetime region being locally formed in an outer peripheral region enclosing a type anode region of the diode, and hastening the elimination of accumulated carriers (JP-A-9-246570). However, there is concern that simply hastening the elimination of the accumulated carriers will lead to a rise in on-state voltage, because of which, in order to control the lifetime of the accumulated carriers without causing the on-state voltage (forward voltage drop) to rise, thereby realizing high speed switching characteristics, there has been a disclosure of technology relating to a method whereby a crystal defect layer region having a carrier recombination center is locally formed by an irradiation with proton, helium, or the like, so as to be a selective region, selective in the depth direction and leaving intervals in a direction parallel to the main surface (JP-A-10-178019). Furthermore, there is known a helium ion irradiation method that enables the fabrication of a lifetime control region restricted to a predetermined range of depths straddling the p-n junction over the whole of a diode chip, or in an edge portion of the anode region. Specifically, there has been disclosed a method whereby the concentration of reverse recovery current is suppressed, and the resistance thereto is increased, by a localized low lifetime layer being formed in a region on both sides straddling the p-n junction plane of a bottom portion of a $p^+$ type diffusion region (anode region), as shown in FIGS. 2 and 3, and shortening the lifetime of electron-hole carriers accumulated in the vicinity of the p-n junction plane of a boundary portion between an active region and a junction termination structure region (JP-A-2001-135831 and JP-A-2005-340528).

Also, a diode having a portion wherein a p-type anode region is extended from an end portion of contact with an anode electrode for a predetermined distance to the chip outer periphery is described in JP-A-2010-50441. There is also a description of a structure wherein another electrode separate from the anode electrode is brought into contact with the anode extension portion, and furthermore, the lifetime of minority carriers in the p-n junction portion of the anode extension portion is shorter than in other portions.

SUMMARY OF THE INVENTION

However, the helium ion irradiation method relating to the descriptions in JP-A-9-246570 and JP-A-10-178019 is such that it cannot always be said that the extent to which the di/dt resistance is increased is completely satisfactory. Also, the low lifetime region formed using the helium ion irradiation method relating to the descriptions in JP-A-2001-135831 and JP-A-2005-340528 is formed in a region with a comparatively large number of accumulated carriers on both sides so as to straddle the p-n junction of the bottom portion of the diffusion region over the whole of the semiconductor substrate, because of which, the advantage of suppressing reverse recovery current is fairly large, but at the same time, there is a problem in that leakage current over the whole of the p-n junction is liable to increase due to damage being caused to the p-n junction by the helium ion irradiation, and it is supposed that it is difficult to control an appropriate amount of irradiation when carrying out a helium ion irradiation.

The invention, having been contrived bearing in mind the heretofore described points, has an object of providing a semiconductor device such that it is possible to suppress an increase in forward voltage drop, maintain high reverse recovery current resistance, and reduce leakage current.

An aspect of the invention, in order to solve the heretofore described problems, is a semiconductor device including a first conductivity type semiconductor substrate, a second conductivity type semiconductor region having a planar pattern enclosed by four rectangular linear sides and four corner curved sides on one main surface of the semiconductor substrate, a metal electrode forming Ohmic contact with the surface of the semiconductor region, a junction termination structure region including a plurality of second conductivity type guard rings enclosing the outer periphery of the semiconductor region on the one main surface side, and a low lifetime region of a depth within a predetermined distance range sandwiching a p-n junction of a bottom portion of the semiconductor region on the one main surface side and the other semiconductor substrate main surface side of the p-n junction, separated from the one main surface side, wherein the low lifetime region includes a central region that has a portion coinciding with the semiconductor region as seen from the one main surface side and is selectively formed as far as the position of a contact end portion of a region of the coinciding portion with which the semiconductor region and metal electrode are in contact, a peripheral region wherein the central region extends as far as the position of an outer peripheral end of the semiconductor region, and an expanded end portion region wherein the peripheral region extends as far as an outer peripheral end of the innermost of the guard rings. The area of the coinciding portion of the central region may be 20% or more, 80% or less, of the area of the semiconductor region. An aperture portion in the central region in which the low lifetime region is not formed may be separated inwardly from the contact end portion. A corner portion of the aperture portion may be curved. The low lifetime region may have an edge aperture portion in which the low lifetime region is not formed in edges sandwiched by the four corners of the central region and peripheral region. The edge aperture portion may be disposed alternately with the central region and peripheral region along the edges. The width of the edge aperture portion along the edges sandwiched by the four corners may be less than the width of the central region and peripheral region along the edges. The form of the edge aperture portion may be a rectangle long in a direction along the edge. Lifetime other than in the low lifetime region may be longer than in the low lifetime region, and shorter than 10 μs. A light ion irradiation may be a helium ion irradiation. The dose of the helium ion irradiation may be $5 \times 10^{11}$ cm$^{-2}$ or less. The central region may have a non-low lifetime region formed of a planar pattern of one of a stripe form, a lattice form, a polka dot pattern form, or a rectangular concentric ring form. The range of the depth direction of the low lifetime region may be a range of 80% or more, 120% or less, of the depth of the p-n junction. The width along the one main surface of the peripheral region may be 200 μm or more. The width along the one main surface of the expanded end portion region may be 20 μm or more, 100 μm or less.

According to the invention, it is possible to provide a semiconductor device such that it is possible to suppress an increase in forward voltage drop, maintain high reverse recovery current resistance, and reduce leakage current.

DETAILED DESCRIPTION OF THE INVENTION

Hereafter, a detailed description will be given, with reference to the drawings, of examples according to a semiconductor device of the invention, and specifically, of a case of a diode. In the specification and attached drawings, a layer or region being prefixed by n or p indicates that electrons or holes respectively are majority carriers. Also, + or − being added to n or p indicates that the impurity concentration is relatively higher or lower respectively. The same reference signs are given to the same configurations in the following description of the examples and in the attached drawings, and redundant descriptions will be omitted. Also, the attached drawings described in the examples, so as to be easy to see and easy to understand, are not drawn to an accurate scale or dimensional ratio. The invention is not limited to the details of the examples described below, provided that the scope of the invention is not exceeded.

First Embodiment

Figure 1:
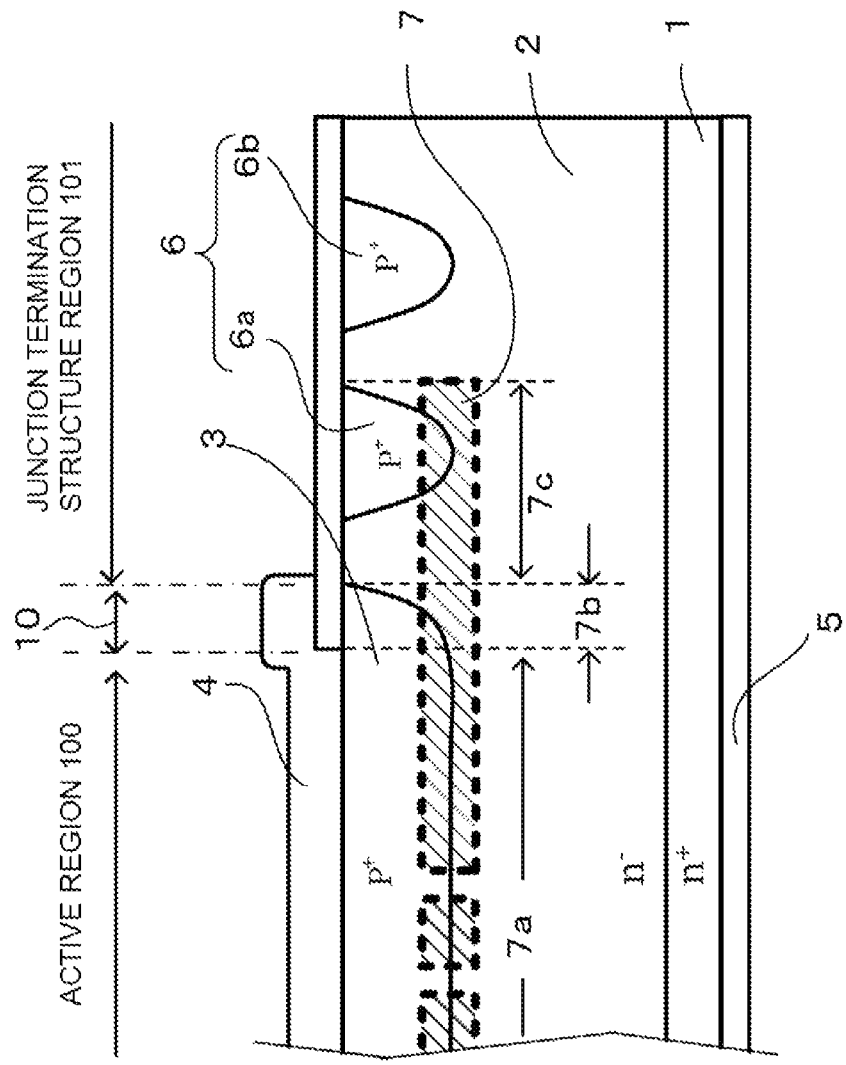
FIG. 1 is a main portion sectional view of a diode having a low lifetime region according to the invention restricted in both the depth direction and main surface direction.
Figure 2:
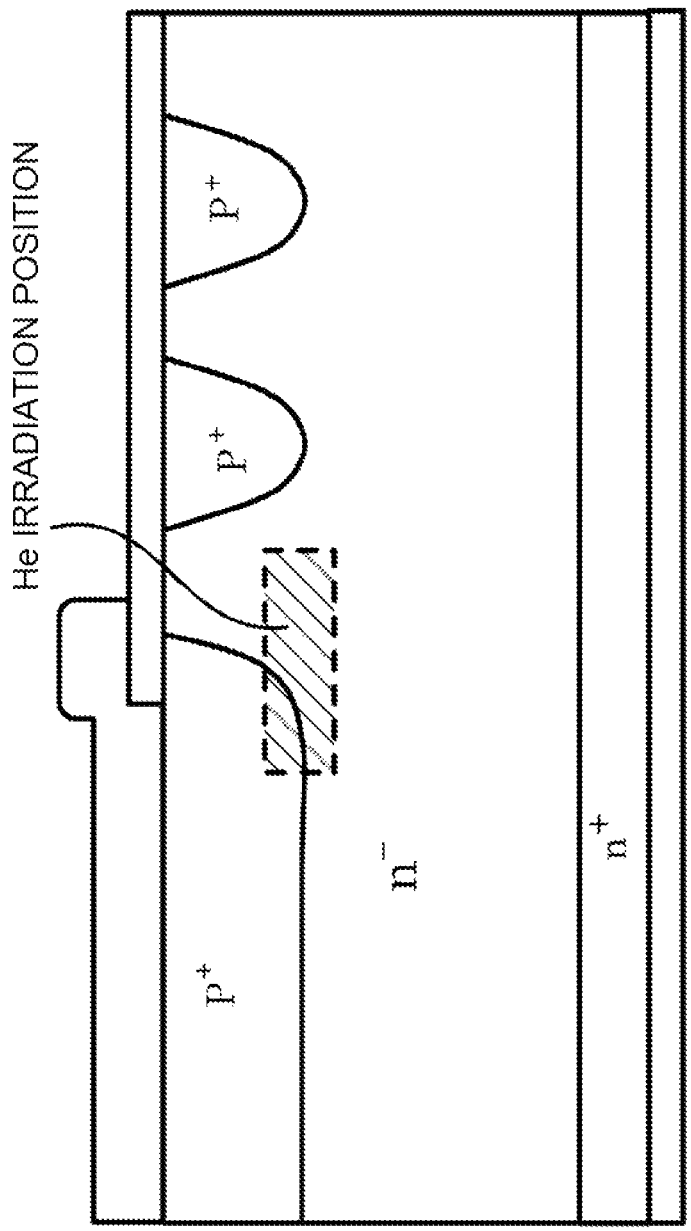
FIG. 2 is a main portion sectional view of a heretofore known diode including a low lifetime region partially restricted in a restricted region sandwiching a p-n junction of a bottom portion of a p-type diffusion region of a semiconductor substrate and also in a direction parallel to a main surface.
Figure 3:
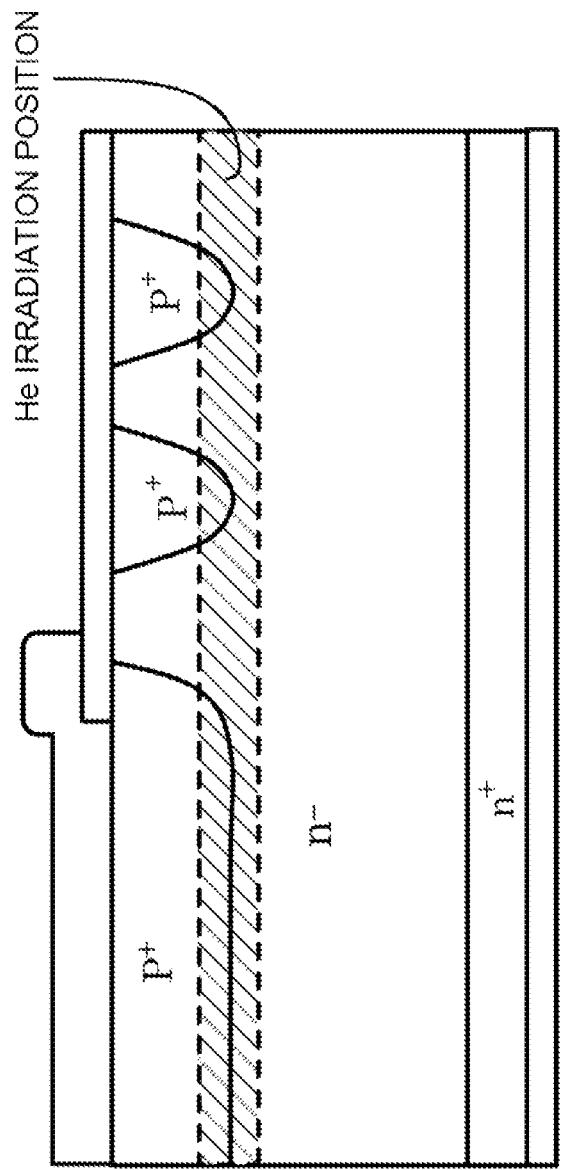
FIG. 3 is a main portion sectional view of a heretofore known diode including a low lifetime region in a region of a restricted depth sandwiching a p-n junction of a bottom portion of a p-type diffusion region over the whole of a semiconductor substrate.

A diode according to the invention shown in a main portion sectional view of FIG. 1 is such that an n$^-$ type semiconductor layer 2 that forms a cathode region is provided as a drift layer over the whole of one surface of an n$^+$ type semiconductor layer 1, and a cathode electrode 5 is in conductive contact with the other surface on the opposite side of the n$^+$ type semiconductor layer 1. Furthermore, a p$^+$ type diffusion region 3 that forms an anode region is provided to a predetermined depth in a surface layer of the n$^-$ type semiconductor layer 2 (drift layer) as a region with a selective rectangular planar pattern.

Specifically, a quadrilateral in which four linear sides and four corners of the four sides are linked at curved corner portions is adopted as the rectangular anode region. Although not shown in the drawing, the p$^+$ type diffusion region 3 may be formed in a pattern selectively including a portion in the interior thereof in which the p$^+$ type diffusion region 3 is not formed. A diode anode electrode 4 is formed on the surface inside this kind of p$^+$ type diffusion region 3 (anode region). The p$^+$ type diffusion region 3 (anode region) is in conductive contact, leaving a predetermined distance to the inner peripheral side from the termination thereof. A main current flowing through the diode flows from the anode electrode 4 to the cathode electrode 5 on the other side in an active region 100.

Also, a junction termination structure region 101 encloses the outer periphery of the active region 100 on the surface side. A p+ type guard ring region 6, which is a ring-like p+ type diffusion region, is formed in the junction termination structure region 101. The p+ type guard ring region encloses the outer periphery of the p+ type diffusion region 3 so as to be separated by a predetermined even distance. Also, a plurality of the p+ type guard ring regions are formed in accordance with breakdown voltage. The surface of the junction termination structure region 101 is covered with a dielectric film such as $SiO_2$. Because of this, the p+ type guard ring region 6, a field plate (not shown), and the like, alleviate an electrical field and are responsible for long-term reliability of breakdown voltage.

The anode electrode 4 forms an Ohmic contact with the surface of the p+ type diffusion region 3. In the same way, the cathode electrode 5 forms an Ohmic contact with the n+ type semiconductor layer 1.

A low lifetime region 7 is formed in a region from the active region 100 to one portion of the junction termination structure region 101. The low lifetime region is formed by an irradiation with helium ions, hydrogen ions (protons), or the like, being carried out from, for example, the front surface side of the semiconductor substrate, and heat treatment being carried out as necessary. Hereafter, a description will be given with a case of irradiating with helium ions as an example. The low lifetime region 7 is separated in the depth direction from the anode electrode 4. Also, the low lifetime region 7 is formed from a depth less than the diffusion depth of the p+ type diffusion region 3 to a depth greater than the diffusion depth of the p+ type diffusion region 3, including the p-n junction of the p+ type diffusion region 3 and n− type semiconductor layer 2. The depth of the upper end of the low lifetime region 7 corresponds to, for example, a position at 80% of the diffusion depth of the p+ type diffusion region 3, while the depth of the lower end corresponds to, for example, a position at 120% of the diffusion depth of the p+ type diffusion region 3. In this way, the depth range of the low lifetime region 7 may be a range with the depth of the p-n junction of the p+ type diffusion region 3 and n− type semiconductor layer 2 as an approximate center, and of an extent such that the upper end of the low lifetime region 7 is separated from the anode electrode. By adopting this kind of depth range, it is possible, for example, as will be described later, to keep leakage current low, and to increase di/dt resistance when there is reverse recovery.

Figure 4A:
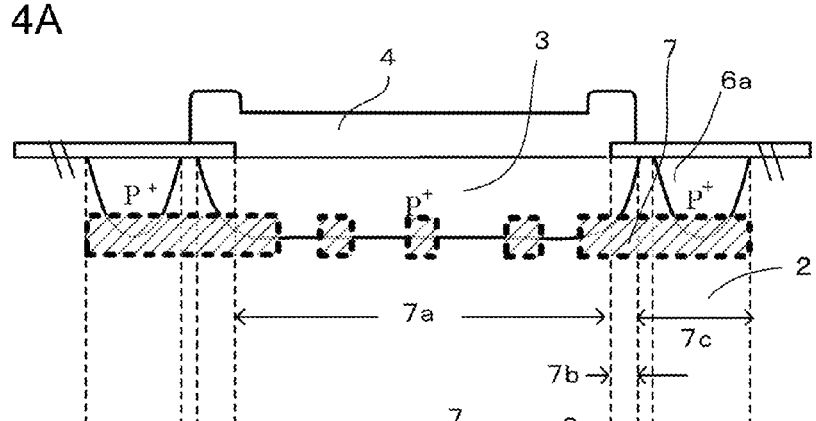
FIGS. 4A and 4B are first plan views of the low lifetime region according to the invention.
Figure 4B:
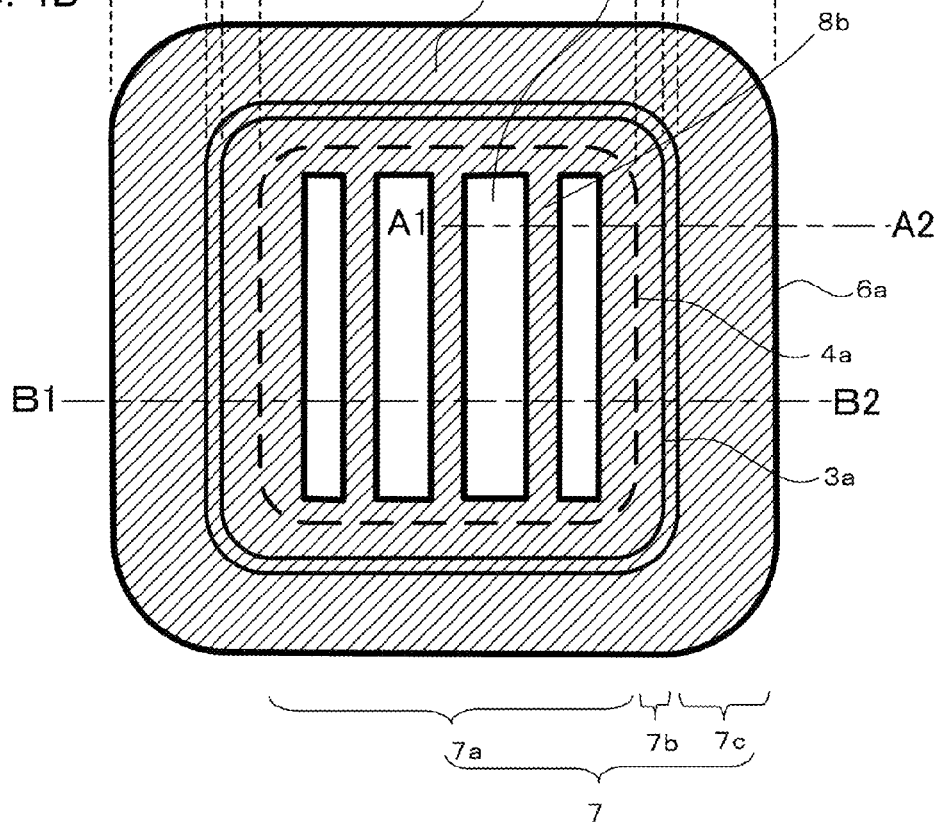

FIG. 4A is a sectional view wherein FIG. 1 is shown so as to further include the active region 100 and one portion of the outer periphery thereof, while FIG. 4B is a plan view thereof. As shown in FIG. 4B, the obliquely hatched low lifetime region 7 has three regions. The first region is a central region 7a that coincides with a portion wherein a bottom portion of the p-n junction of the p+ type diffusion region 3 is a parallel plane. The central region 7a is a selective lifetime formation region including a region in which the lifetime of minority carriers is severely reduced and a region in which the lifetime is either not reduced or is relatively little reduced. The position of the outer peripheral end portion of the low lifetime region 7 is the position of an end portion of the region in which the anode electrode 4 is in direct contact with the surface of the semiconductor substrate including the p+ type diffusion region 3, that is, the position of an anode electrode contact end 4a. Herein, the low lifetime region 7 is separated in the depth direction from the surface of the semiconductor substrate. Because of this, it is helpful to define the position of the low lifetime region 7, so that it is possible to describe the positional relationship with a p+ type diffusion region and the like on the surface of the semiconductor substrate. Therefore, a position of the low lifetime region 7 projected vertically onto the surface of the semiconductor substrate is defined as the position of the low lifetime region 7. The position of the low lifetime region 7 may be thought of, for example, as being the position of the low lifetime region 7 on the surface when viewing the surface of the semiconductor substrate from above.

The second of the three regions of the low lifetime region 7 is a peripheral region 7b, in contact with the central region 7a, from the outer peripheral end of the central region 7a to a position whereat the p-n junction of the p+ type diffusion region 3 curves owing to a lateral diffusion and is exposed on the surface, that is, the outer peripheral end of the p+ type diffusion region 3. The surface of the peripheral region 7b is covered with a dielectric film.

The third of the three regions of the low lifetime region 7 is an expanded end portion region 7c, in contact with the peripheral region 7b, expanded from a p+ type outer peripheral end 3a, which is the outer peripheral end of the p+ type diffusion region 3, to a ring outer peripheral end 6b, which is the outer end of an innermost guard ring 6a formed to be the innermost of the p+ type guard ring regions 6. The planar direction width of the expanded end portion region 7c, although depending on the width of the innermost guard ring 6a, may be for example in the range approximately of 20 μm to 100 μm.

A non-hatched region (white portion) provided inside the central region 7a in FIG. 4B is a region in which lifetime is not reduced, or is reduced little in comparison with the hatched region, as previously described. That is, it is a non-irradiated region 8a into which helium ions are not implanted when irradiating with helium ions, owing to the helium ions being blocked by a mask or the like. Meanwhile, a region into which helium ions are implanted is an irradiated region 8b. The non-irradiated region 8a is formed in the central region 7a of the low lifetime region 7. Also, the pattern of the irradiated region 8b neighboring the non-irradiated region 8a is of a strip form. Because of this, the average length of minority carrier lifetime in the central region 7a including the irradiated region 8b and non-irradiated region 8a is long in comparison with that in the peripheral region 7b and expanded end portion region 7c. That is, the minority carrier lifetime is shortest in the peripheral region 7b and expanded end portion region 7c. Because of this, it is possible to reduce leakage current by reducing the generation center thereof in the vicinity of the main p-n junction in the central region 7a. In addition to this, it is possible to prevent a concentration of reverse recovery current from the inner peripheral side of the anode electrode contact end 4a in the innermost guard ring 6a, thus increasing reverse recovery resistance.

The position of the non-irradiated region 8a may be separated from the position of the anode electrode contact end 4a. This is because when the position of the region in which lifetime is not reduced coincides with the position of the anode electrode contact end 4a, the effect of preventing a concentration of reverse recovery current at the anode electrode contact end 4a is slightly diminished. Also, corner portions of the non-irradiated region 8a may be rounded to be lines having curvature.

Also, "lifetime is little reduced" as mentioned above means reducing the lifetime in the whole or one portion of the n− type semiconductor layer 2 (the drift layer) in order to shorten the reverse recovery time of the diode, separately from the formation of the low lifetime region 7. For example, crystal defects are introduced into the drift layer by an irradiation with electron beams with a range longer than the thickness of the drift layer, an irradiation with protons into the interior of the drift layer to a depth sufficiently greater than that of the p⁺ diffusion region 3, a platinum diffusion, or the like, thus reducing lifetime. The value of the minority carrier lifetime as a result of these reductions is longer than that of the lifetime in the low lifetime region 7, and shorter than a value (for example, 10 μs or more) when not carrying out a lifetime reducing process. As high-speed reverse recovery characteristics are required of a free wheeling diode (FWD) connected in anti-parallel to an inverter switching element (for example, a commonly known MOSFET or IGBT), lifetime reduction in the n⁻ type semiconductor layer 2 is necessary. Meanwhile, a sufficiently low forward voltage is required of a diode for a converter that converts a commercial alternating current to direct current in order to supply direct current voltage to the inverter. Because of this, it is actually rare that the lifetime in the whole of the n type semiconductor layer 2 is reduced, with the reduction of lifetime in the low lifetime region 7 alone being sufficient.

The operational advantages of dividing the low lifetime region 7 into the central region 7a, which is the region coinciding with the p⁺ type diffusion region 3, and the peripheral region 7b and expanded end portion region 7c are as follows.

The first advantage is that the lifetime in the peripheral region 7b and expanded end portion region 7c is lower than the average lifetime in the central region 7a. Because of this, an advantage is achieved in that a concentration of reverse recovery current in the termination portion of the anode electrode, in particular the corner portions, is suppressed, without increasing leakage current.

The second advantage is that a buffer region 10 is provided between the termination of the anode region and the anode region in contact with the anode electrode, and the lifetime in the buffer region 10 is shorter than the lifetime in the central region 7a. The buffer region 10 corresponds to the width in the planar direction of the peripheral region 7b, and this planar distance is sufficiently longer than the lateral diffusion distance of the p⁺ type diffusion region 3. When there is reverse recovery, the holes of the junction termination structure region 101 flow into the p⁺ type diffusion region 3 in accordance with electrostatic potential distribution, and flow through the buffer region 10. Subsequently, the holes flow into the anode electrode 4 from the anode electrode contact end 4a. That is, the hole current concentrates in the anode electrode contact end 4a. The lifetime in the buffer region 10 is also the lifetime in the peripheral region 7b, because of which, when the planar distance of the peripheral region 7b is sufficiently long, the carrier concentration reduction effect of the peripheral region 7b increases. Because of this, the density of the holes flowing into the buffer region 10 decreases. Because of this, the concentration of the hole current in the contact end is suppressed. It is good when the width in the planar direction of the peripheral region 7b is 200 μm or more in a 1,200V rated voltage class, and 300 μm or more in a 1,700V rated voltage class.

EXAMPLE 1

Figure 8:
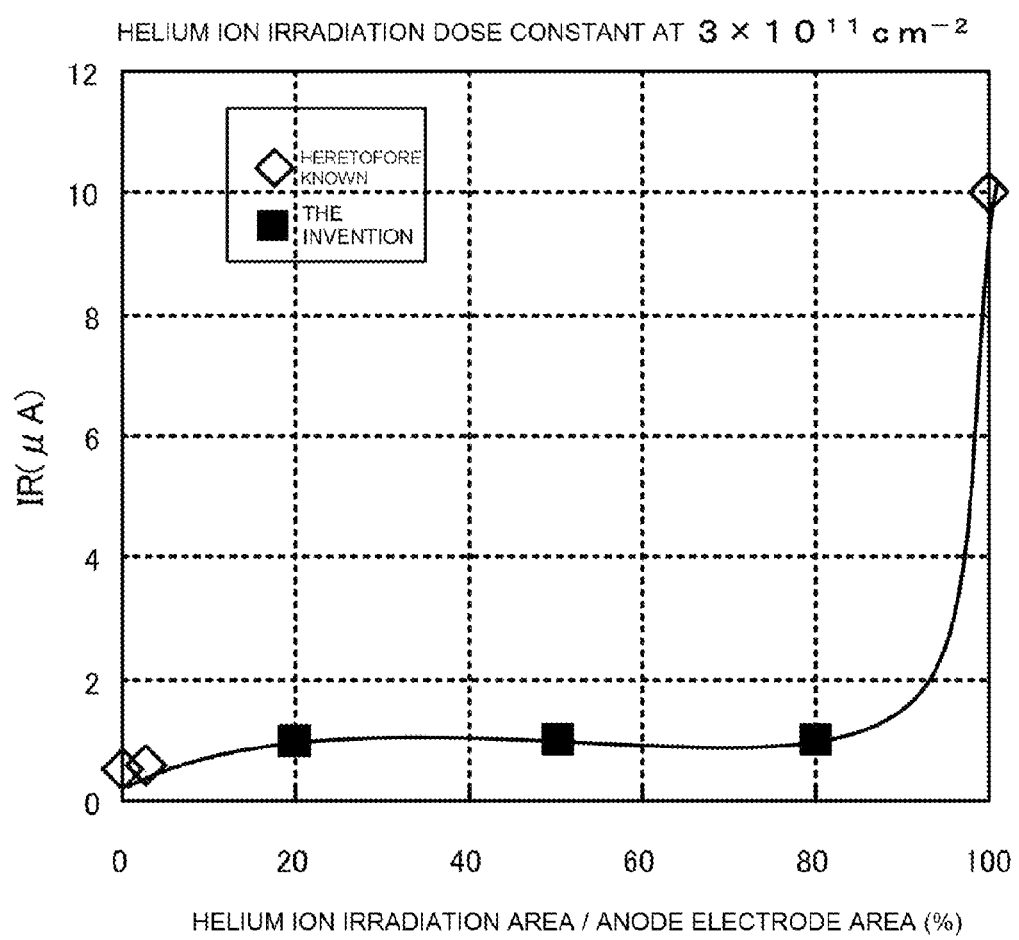
FIG. 8 is a relationship diagram showing the relationship between the ratio of the area of the low lifetime region in an active region and the reverse leakage current.

FIG. 8 is a relationship diagram showing the relationship between the ratio of the area of helium ion irradiation into the central region 7a with respect to the whole area of the diode anode electrode region (corresponding to the central region) and the reverse leakage current (IR). In both relationship diagrams, the helium ion irradiation dose is $3 \times 10^{11}$ cm⁻². In FIG. 8, it is shown that the reverse leakage current barely increases in comparison with when there is no irradiation when the ratio of the area of helium ion irradiation into the central region is within a range of 20% to 80%, but that the reverse leakage current increases sharply on the ratio exceeding 80%. The reason is that, on the ratio exceeding 80%, damage to the p-n junction of the central region caused by the helium ion irradiation cannot be ignored.

EXAMPLE 2

Figure 9:
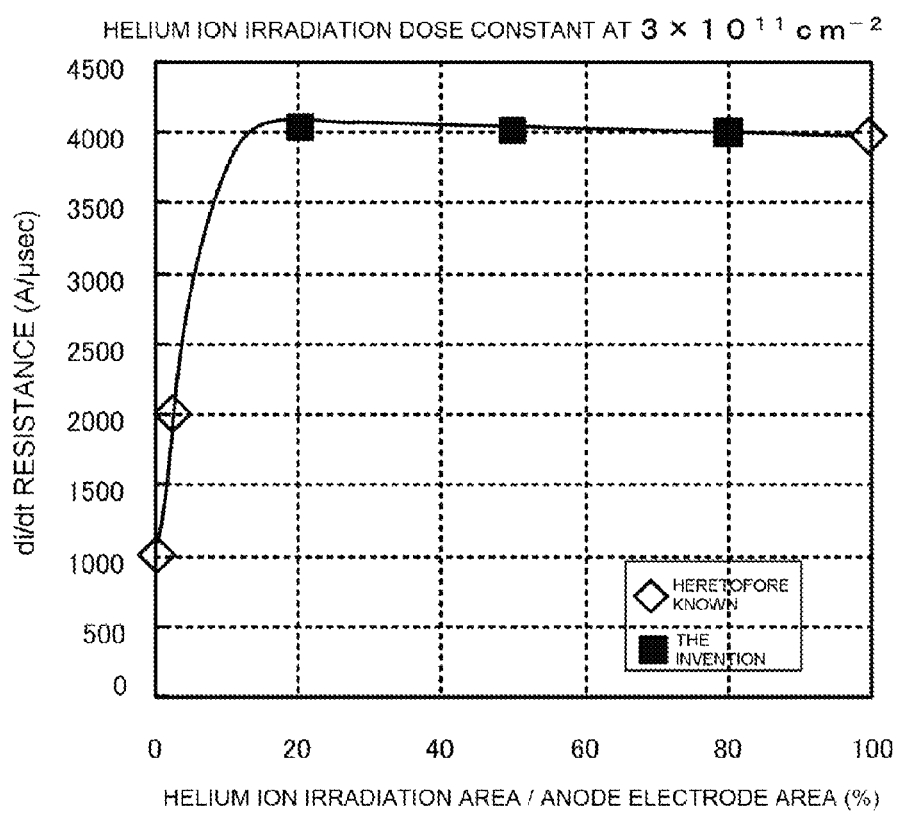
FIG. 9 is a relationship diagram showing the relationship between the ratio of the area of the low lifetime region inside the active region and the di/dt resistance.

FIG. 9 is a relationship diagram showing the relationship between the ratio of the area of the low lifetime region inside the active region and the di/dt resistance. In FIG. 9, it is shown that when the ratio of the area of helium ion irradiation into the central region 7a with respect to the whole area of the diode anode electrode region (corresponding to the central region) is 20% or higher, the di/dt resistance is approximately the same as when the irradiation area is 100%, but that the di/dt resistance decreases sharply when the ratio is less than 20%. That is, it is shown that when a helium ion irradiation is not carried out over an area of 80% or more of the anode electrode region, the di/dt resistance does not increase sufficiently. Consequently, it is understood from FIGS. 8 and 9 that the ratio of the area of helium ion irradiation into the central region may be within a range of 20% or more, 80% or less.

EXAMPLE 3

Figure 10:
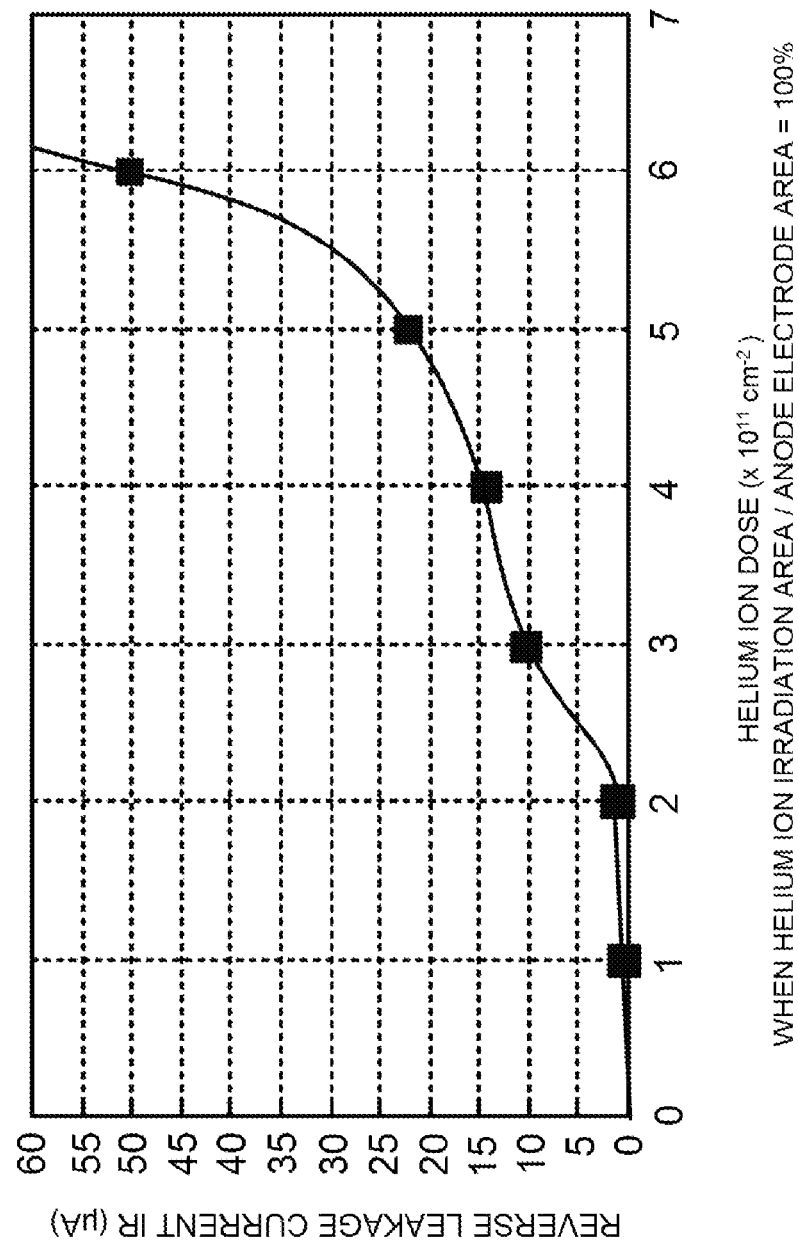
FIG. 10 is a relationship diagram showing the relationship between the dose when a helium ion irradiation is carried out over the whole area of an anode electrode and the reverse leakage current.

FIG. 10 is a relationship diagram showing the relationship between the dose when a helium ion irradiation is carried out over the whole area of the anode electrode and the leakage current when there is reverse bias. In the invention, the helium ion irradiation dose may be less than $5 \times 10^{11}$ cm⁻². The reason is that, as seen from FIG. 10, the leakage current increases in excess of 25 μA when the dose is greater than $5 \times 10^{11}$ cm⁻², and there is a lessening of the advantage of the leakage current decreasing when the proportion of the helium ion irradiation area with respect to the p-type semiconductor region (anode region) is 20% or more, 80% or less.

In this way, an advantage is obtained in that, by the low lifetime region according to the invention being such that the ratio of the helium ion irradiation area with respect to the area of the anode electrode region (corresponding to the central region) is reduced to a predetermined ratio, damage to the p-n junction between the p⁺ type diffusion region 3 (anode region) bottom portion and the n⁻ type semiconductor layer 2 decreases in comparison with the case of an all-over irradiation, and the reverse leakage current decreases. Also, there is an advantage in that, provided that the irradiation area is 20% or more, a di/dt resistance approximately the same as when the helium ion irradiation is carried out over the whole of the active region is obtained.

Second Embodiment

Figure 5A:
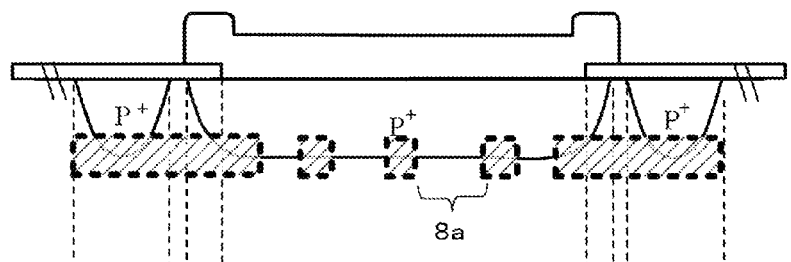
FIGS. 5A and 5B are second plan views of the low lifetime region according to the invention.
Figure 5B:
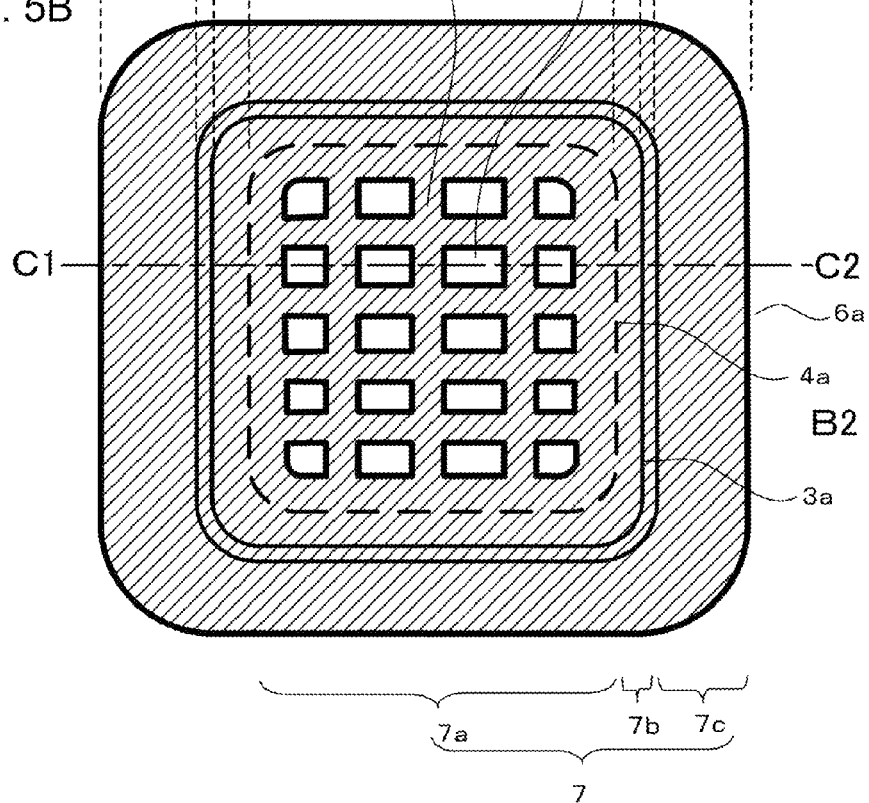

FIGS. 5A and 5B are an example of a planar pattern of the low lifetime region 7 of one chip of a diode formed on a semiconductor substrate according to a second embodiment of the invention. FIG. 5A is a main portion sectional view showing the diode p-type anode region 3 and the innermost region 6a of the guard rings 6 enclosing the outer periphery of the p-type anode region 3 at a predetermined even distance. FIG. 5B is a plan view seen from above the diode. The section of FIG. 5A is a sectional view when cutting along a C1-C2 line of FIG. 5B, and FIGS. 5A and 5B are drawn so that the distances in each on the main surface of the semiconductor substrate correspond to each other.

A difference from the first embodiment is that an irradiated region 8b in the central region 7a is of a rectangular lattice form rather than a strip form. By adopting a rectangular lattice form, it is possible for the lifetime distribution in the central region 7a to be more nearly even than in the case of a strip form. Carriers are liable to concentrate in the non-irradiated region 8a with the longer lifetime when there is reverse recovery but, by adopting the rectangular lattice form, it is easier to distribute the concentrated places (the non-irradiated region 8a) over the whole of the central region 7b.

Third Embodiment

Figure 6A:
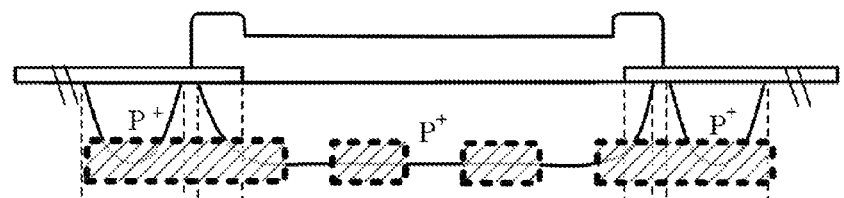
FIGS. 6A and 6B are third plan views of the low lifetime region according to the invention.
Figure 6B:
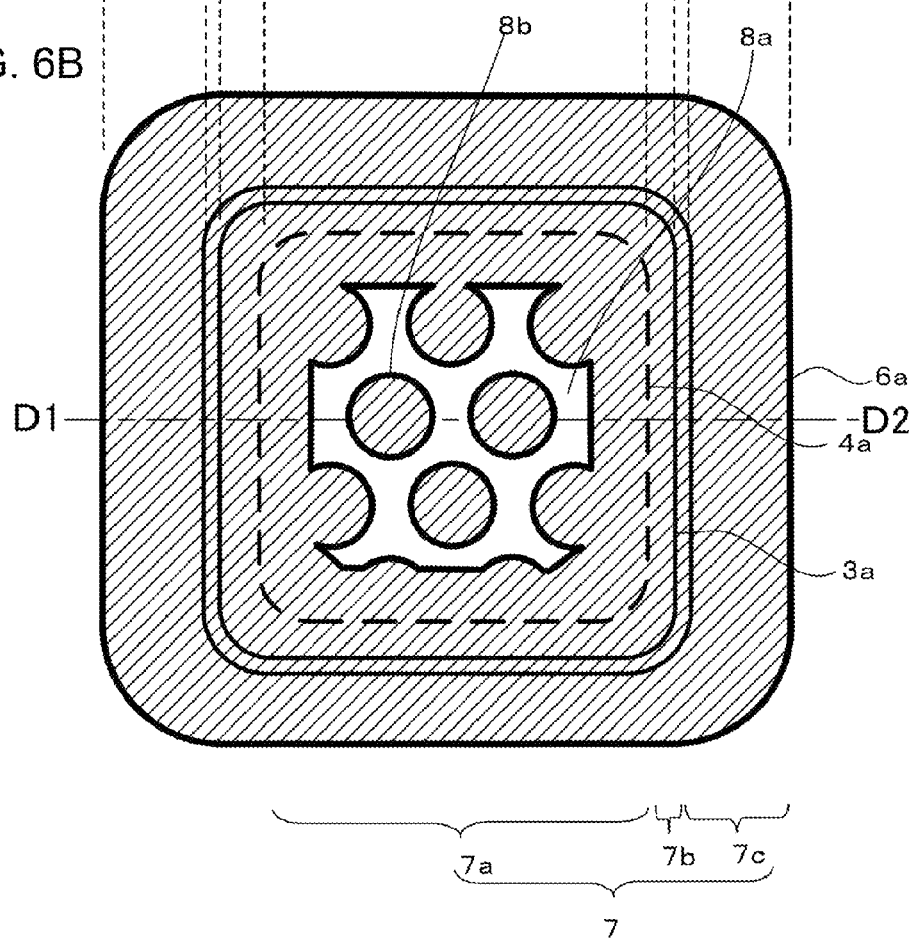

FIGS. 6A and 6B are an example of a planar pattern of the low lifetime region 7 of one chip of a diode formed on a semiconductor substrate according to a third embodiment of the invention. FIG. 6A is a main portion sectional view showing the diode p-type anode region 3 and the innermost region 6a of the guard rings 6 enclosing the outer periphery of the p-type anode region 3 at a predetermined even distance. FIG. 6B is a plan view seen from above the diode. The section of FIG. 6A is a sectional view when cutting along a D1-D2 line of FIG. 6B, and FIGS. 6A and 6B are drawn so that the distances in each on the main surface of the semiconductor substrate correspond to each other.

A difference from the second embodiment is that the irradiated region 8b in the central region 7a is of a dot form rather than a rectangular lattice form, and the dots are disposed in the form of lattice points of a triangular lattice. By so doing, it is possible to link the non-irradiated region 8a without disconnection, because of which, conductivity modulation occurs more easily than in the case of a rectangular lattice form, and it is possible to further reduce forward voltage drop.

Fourth Embodiment

Figure 7A:
FIGS. 7A and 7B are fourth plan views of the low lifetime region according to the invention.
Figure 7B:
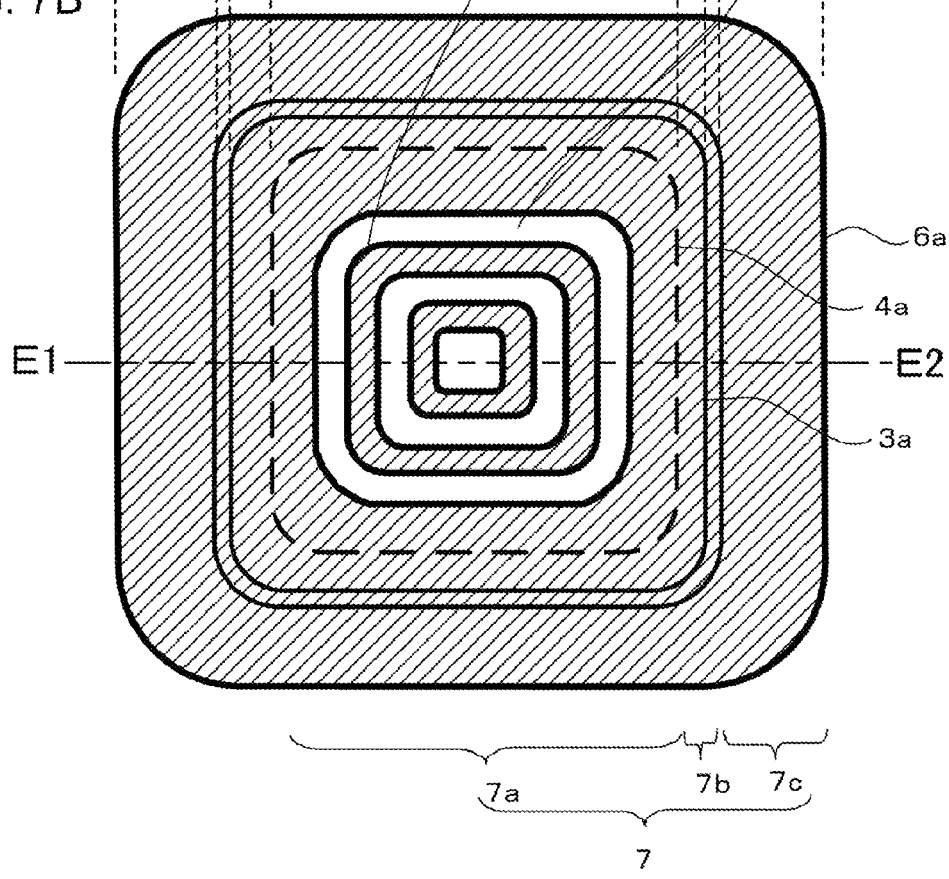

FIGS. 7A and 7B are an example of a planar pattern of the low lifetime region 7 of one chip of a diode formed on a semiconductor substrate according to a fourth embodiment of the invention. FIG. 7A is a main portion sectional view showing the diode p-type anode region 3 and the innermost region 6a of the guard rings 6 enclosing the outer periphery of the p-type anode region 3 at a predetermined even distance. FIG. 7B is a plan view seen from above the diode. The section of FIG. 7A is a sectional view when cutting along an E1-E2 line of FIG. 7B, and FIGS. 7A and 7B are drawn so that the distances in each on the main surface of the semiconductor substrate correspond to each other.

A characteristic of the fourth embodiment is that the non-irradiated region 8a and irradiated region 8b in the center region 7a are of a donut form, and are disposed in the form of concentric circles (actually a rectangular form with rounded corner portions rather than a circle), with the central position thereof as the approximate center of the chip. By regulating the width of the donut form, it is possible to vary the carrier distribution of the central region 7a, particularly in the vicinity of the center of the chip and in a portion near the peripheral region 7b. For example, the ratio of the area of the irradiated region 8b with respect to the non-irradiated region 8a is increased in a portion near the peripheral region 7b, while the ratio of the area in a near-field region including the center of the chip is reduced. By so doing, the carrier distribution is such that the carriers can be distributed in a high concentration in the active region 100, because of which the carrier concentration of the junction termination structure region 101 can be relatively low, and the extent of carrier concentration in the peripheral region 7b is thus alleviated. Therefore, it is possible to increase reverse recovery resistance.

Fifth Embodiment

In a fifth embodiment, a description will be given of a configuration wherein lifetime in a straight portion forming an edge is relatively long compared with lifetime in a corner portion in the peripheral region 7b and expanded end portion region 7c of the low lifetime region 7.

In each of the heretofore described embodiments, practically the whole of the peripheral region 7b and expanded end portion region 7c is the irradiated region 8b, while the non-irradiated region 8a is formed only in the central region 7a. Meanwhile, it is often the case that reverse recovery destruction occurs mainly in the vicinity of a low lifetime corner portion 9 rather than inside, or on an edge of, the rectangular active region 100. Therefore, a helium ion irradiation may be carried out over the whole of at least the low lifetime corner region of the peripheral region 7b and expanded end portion region 7c, while irradiation may be partially carried out in regions of edges sandwiched by neighboring low lifetime corner regions 9, without the whole thereof necessarily being irradiated. The reason is that the hole current concentrates most in the low lifetime corner region 9.

That is, taking the lifetime of the central region 7 to be $\tau_{ACT}$, the lifetime of linear portions of the peripheral region 7b and expanded end portion region 7c to be $\tau_{LINE}$, and in the same way, the lifetime of the low lifetime corner regions 9 of the peripheral region 7b and expanded end portion region 7c to be $\tau_{CN}$, the relationship may be $\tau_{CN} < \tau_{LINE} < \tau_{LINE} < \tau_{ACT}$. Because of this, as the area ratio of the low lifetime region 7 decreases further, it is possible to further reduce the leakage current from the generation center, without reducing the reverse recovery resistance. This kind of planarly selective low lifetime region 7 is formed by forming a required photoresist pattern, and selectively carrying out a helium ion irradiation with the photoresist pattern as a screening mask. Some specific examples of a planar pattern of this kind of low lifetime region 7 are shown hereafter.

Figure 11A:
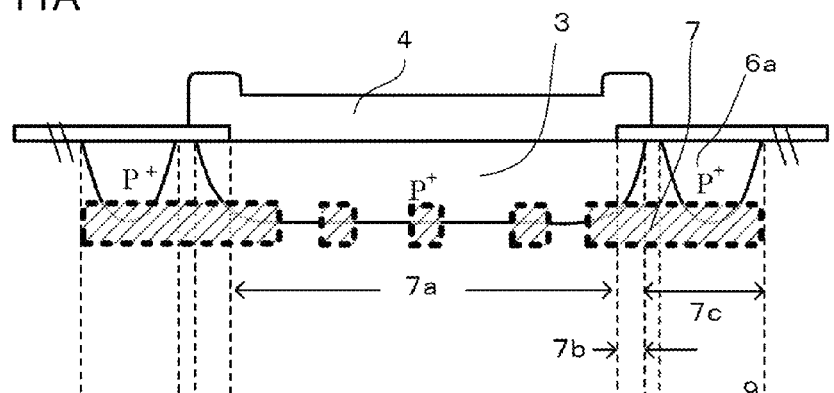
FIGS. 11A and 11B are fifth plan views of the low lifetime region according to the invention.
Figure 11B:
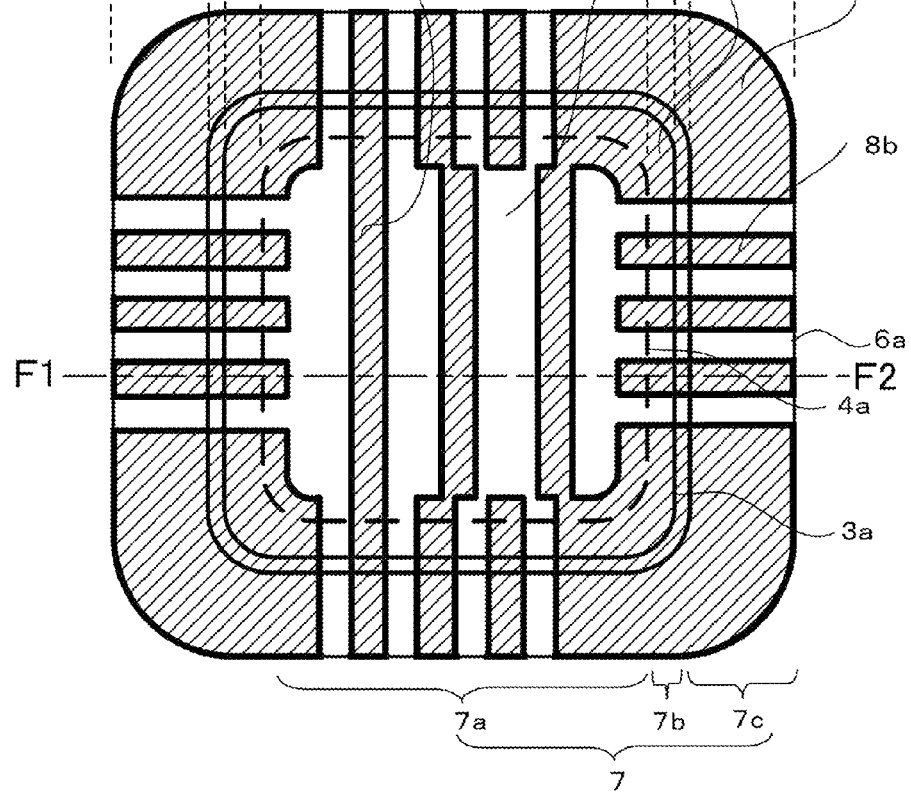

FIGS. 11A and 11B are an example of a planar pattern of the low lifetime region 7 of one chip of a diode formed on a semiconductor substrate according to a fifth embodiment of the invention. FIG. 11A is a main portion sectional view showing the diode p-type anode region 3 and the innermost region 6a of the guard rings 6 enclosing the outer periphery of the p-type anode region 3 at a predetermined even distance. FIG. 11B is a plan view seen from above the diode. The section of FIG. 11A is a sectional view when cutting along an F1-F2 line of FIG. 11B, and FIGS. 11A and 11B are drawn so that the distances in each on the main surface of the semiconductor substrate correspond to each other.

A characteristic of the fifth embodiment is that the non-irradiated region 8a is formed in a strip form by a helium ion irradiation being carried out over the whole of the low lifetime corner regions 9 of the peripheral region 7b and expanded end portion region 7c, and by irradiation being selectively carried out in portions of edges (straight lines) sandwiched by neighboring low lifetime corner regions 9. Also, in the central region 7a, the irradiated region 8b and non-irradiated region 8a are formed in a strip form in the active region 100, in the same way as in the first embodiment. As shown in FIG. 11B, the strip form repetition pitch of the central region 7a and the strip portion pitch of the edge portions of the peripheral region 7b and expanded end portion region 7c need not coincide. Also, strips of two opposing edges of the peripheral region 7b and expanded end portion region 7c are perpendicular to the longitudinal direction of the strips of the central region 7a.

In an edge (straight) portion sandwiched by low lifetime corner regions 9, the irradiated region 8b is cyclically disposed, alternately with the non-irradiated region 8a, along the edge. The width of the irradiated region 8b in this case may be greater than the width of the non-irradiated region 8a. As this enables a reduction of the carrier concentration in the vicinity of the anode electrode contact end 4a, current concentration in the anode electrode contact end 4a when there is reverse recovery is suppressed.

According to the above, it is possible for the relationship of the lifetime in the active region $\tau_{ACT}$, the lifetime in linear portions of the peripheral region 7b and expanded end portion region 7c $\tau_{LINE}$, and the lifetime of the low lifetime corner region 9 $\tau_{CN}$ to be $\tau_{CN} < \tau_{LINE} < \tau_{ACT}$. According to this lifetime relationship, it is possible to reduce the leakage current without reducing the reverse recovery resistance. Also, there is a portion of the anode electrode contact end 4a with which the non-irradiated region 8a coincides. However, by the pattern of the irradiated region 8a being such that the irradiated region 8a is disposed alternately in an edge (straight) portion sandwiched by low lifetime corner regions 9, as described above, it is possible to suppress a concentration of current in the anode electrode contact end 4a when there is reverse recovery.

Sixth Embodiment

Figure 12A:
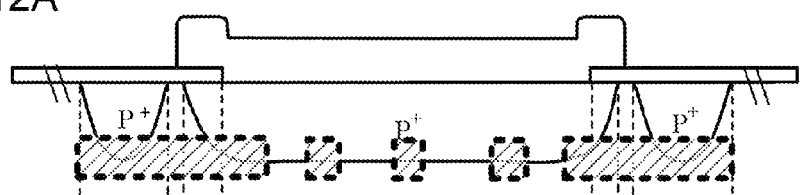
FIGS. 12A and 12B are sixth plan views of the low lifetime region according to the invention.
Figure 12B:
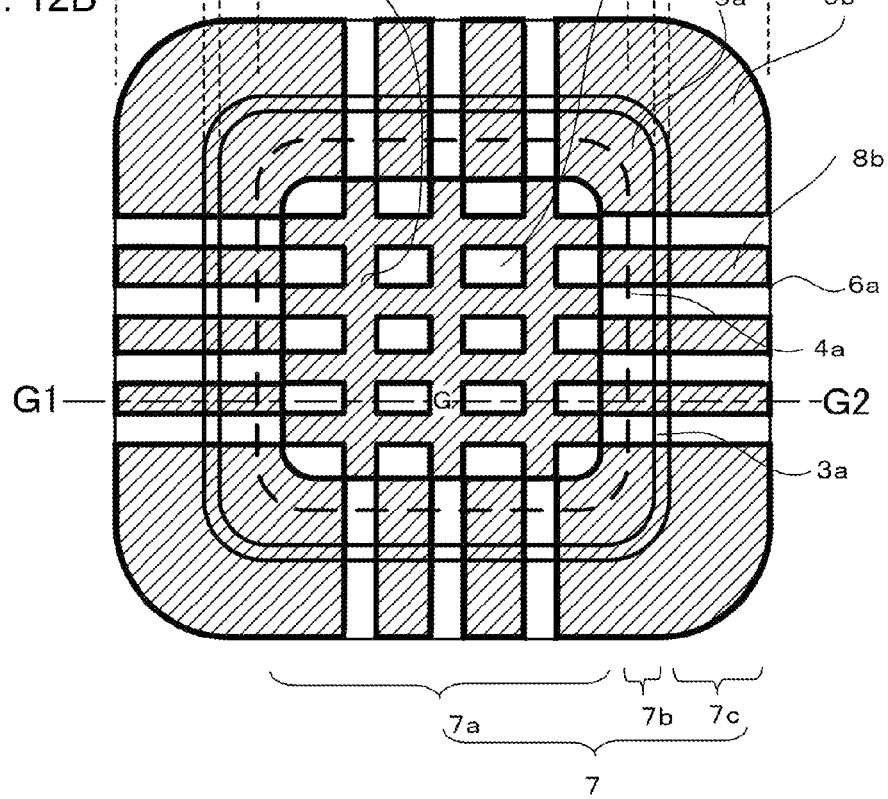

FIGS. 12A and 12B are an example of a planar pattern of the low lifetime region 7 of one chip of a diode formed on a semiconductor substrate according to a sixth embodiment of the invention. FIG. 12A is a main portion sectional view showing the diode p-type anode region 3 and the innermost region 6a of the guard rings 6 enclosing the outer periphery of the p-type anode region 3 at a predetermined even distance. FIG. 12B is a plan view seen from above the diode. The section of FIG. 12A is a sectional view when cutting along a G1-G2 line of FIG. 12B, and FIGS. 12A and 12B are drawn so that the distances in each on the main surface of the semiconductor substrate correspond to each other.

A difference from the fifth embodiment is that the pattern of the non-irradiated region 8a and irradiated region 8b of the central region 7a is of a rectangular lattice form, in the same way as in the second embodiment. Because of this, it is possible to achieve the advantage of the fifth embodiment (a further reduction of the leakage current) while maintaining the advantage of the second embodiment (an evening of lifetime and carrier concentration distribution), without lowering the reverse recovery resistance.

Seventh Embodiment

Figure 13A:
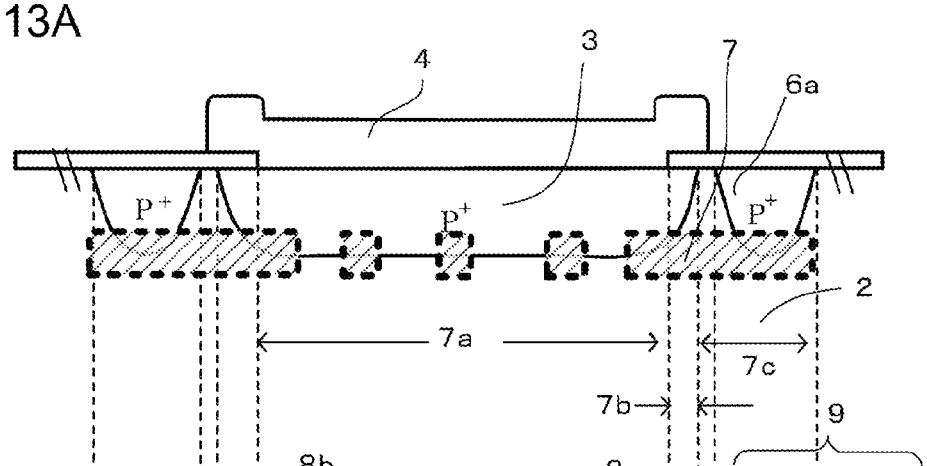
FIGS. 13A and 13B are seventh plan views of the low lifetime region according to the invention.
Figure 13B:
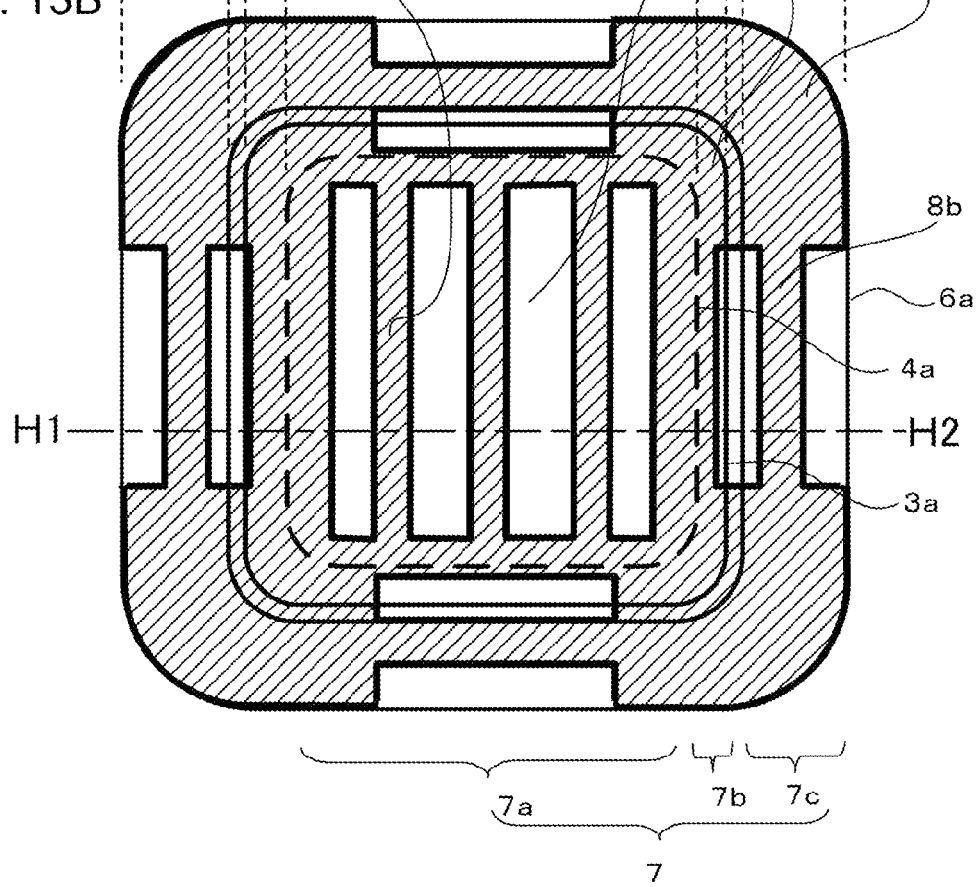

FIGS. 13A and 13B are an example of a planar pattern of the low lifetime region 7 of one chip of a diode formed on a semiconductor substrate according to a seventh embodiment of the invention. FIG. 13A is a main portion sectional view showing the diode p-type anode region 3 and the innermost region 6a of the guard rings 6 enclosing the outer periphery of the p-type anode region 3 at a predetermined even distance. FIG. 13B is a plan view seen from above the diode. The section of FIG. 13A is a sectional view when cutting along an H1-H2 line of FIG. 13B, and FIGS. 13A and 13B are drawn so that the distances in each on the main surface of the semiconductor substrate correspond to each other.

A difference from the fifth embodiment is that the strip pattern of the edge portions of the peripheral region 7b and expanded end portion region 7c is parallel to the edges. Compared with the fifth embodiment, the border between the peripheral region 7b and active region ($p^+$ diffusion region 3) can be enclosed with the low lifetime region, because of which it is possible to further increase the reverse recovery resistance. Also, as the central region 7a and peripheral region 7b of the low lifetime region 7 are immediately below all of the anode electrode contact end 4a, it is possible to suppress a concentration of current in the anode electrode contact end 4a when there is reverse recovery.

Eighth Embodiment

Figure 14A:
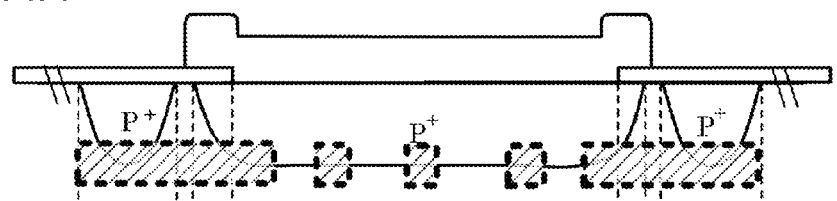
FIGS. 14A and 14B are eighth plan views of the low lifetime region according to the invention.
Figure 14B:
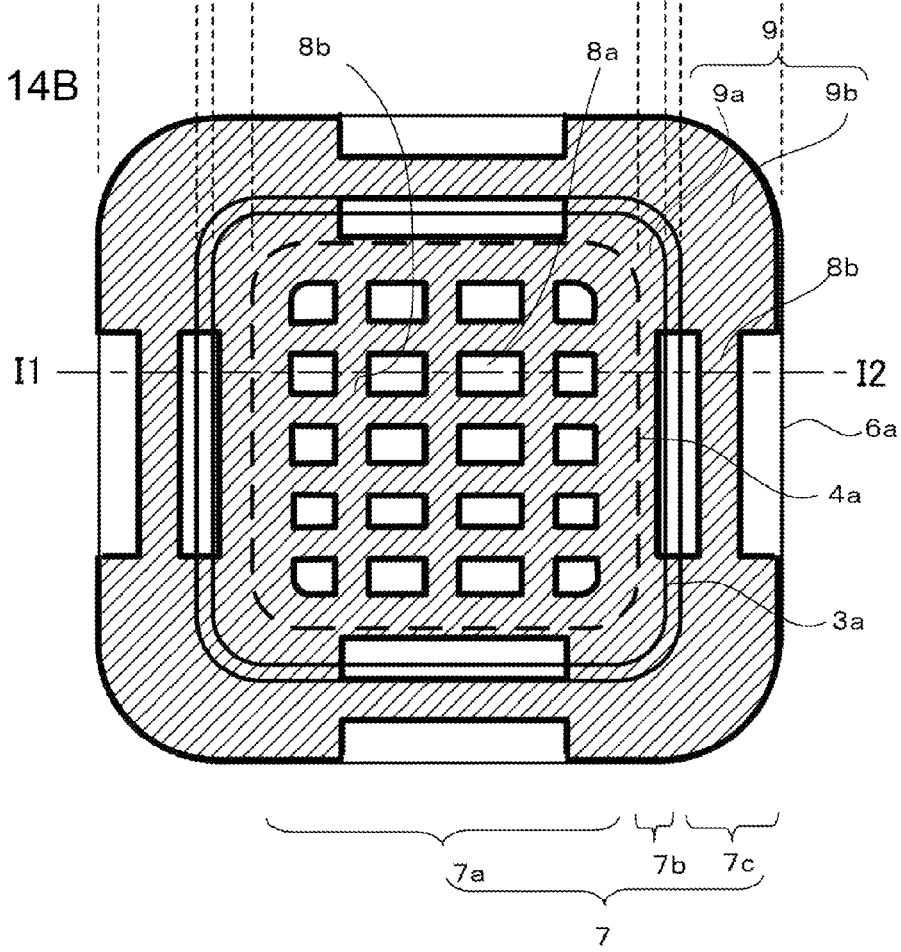

FIGS. 14A and 14B are an example of a planar pattern of the low lifetime region 7 of one chip of a diode formed on a semiconductor substrate according to an eighth embodiment of the invention. FIG. 14A is a main portion sectional view showing the diode p-type anode region 3 and the innermost region 6a of the guard rings 6 enclosing the outer periphery of the p-type anode region 3 at a predetermined even distance. FIG. 14B is a plan view seen from above the diode. The section of FIG. 14A is a sectional view when cutting along an I1-I2 line of FIG. 14B, and FIGS. 14A and 14B are drawn so that the distances in each on the main surface of the semiconductor substrate correspond to each other.

A difference from the seventh embodiment is that the low lifetime region pattern of the central region 7a is of a rectangular lattice form. It is possible to even the lifetime and carrier concentration distribution of the active region further than in the seventh embodiment.

Ninth Embodiment

Figure 15A:
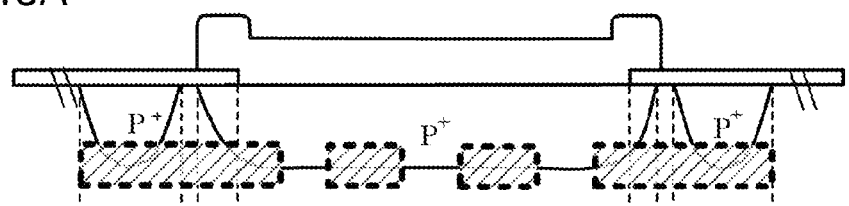
FIGS. 15A and 15B are ninth plan views of the low lifetime region according to the invention.
Figure 15B:
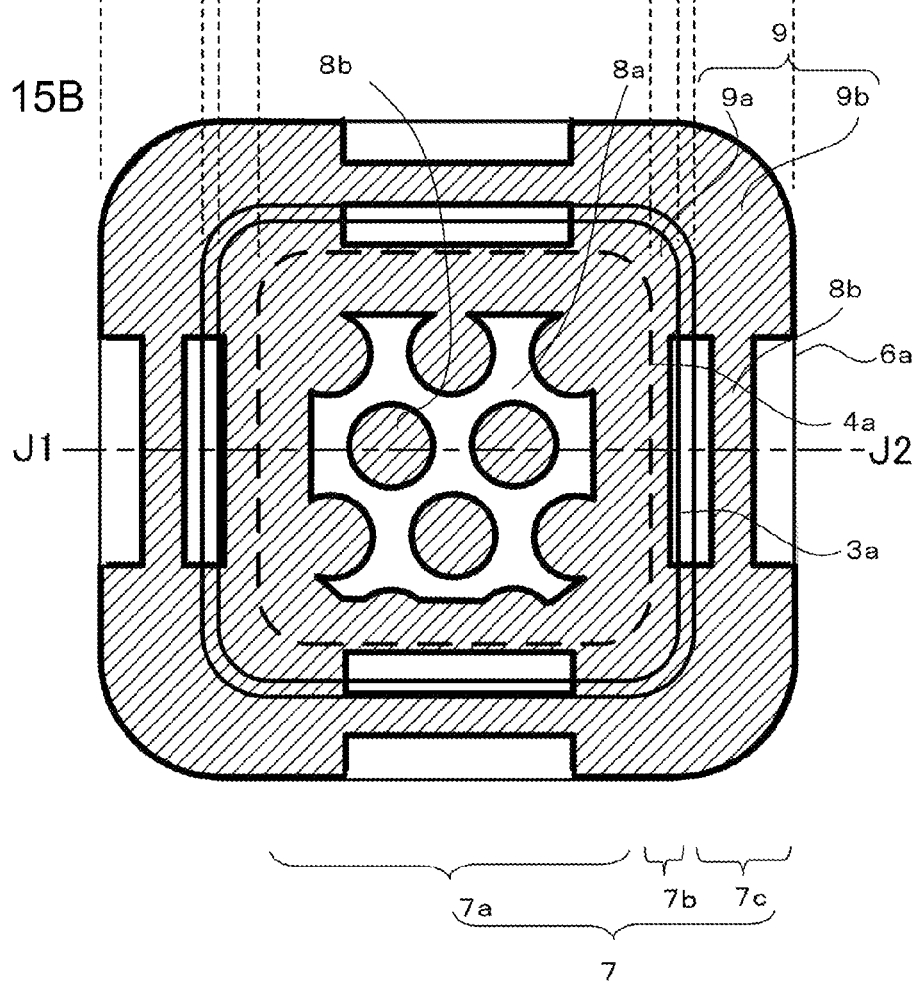

FIGS. 15A and 15B are an example of a planar pattern of the low lifetime region 7 of one chip of a diode formed on a semiconductor substrate according to a ninth embodiment of the invention. FIG. 15A is a main portion sectional view showing the diode p-type anode region 3 and the innermost region 6a of the guard rings 6 enclosing the outer periphery of the p-type anode region 3 at a predetermined even distance. FIG. 15B is a plan view seen from above the diode. The section of FIG. 15A is a sectional view when cutting along a J1-J2 line of FIG. 15B, and FIGS. 15A and 15B are drawn so that the distances in each on the main surface of the semiconductor substrate correspond to each other.

A difference from the seventh embodiment is that the low lifetime region pattern of the central region 7a is of a dot form, in the same way as in the third embodiment. Because of this, it is possible to reduce the leakage current without losing reverse recovery resistance, and furthermore, to achieve the same advantage as in the third embodiment.

Tenth Embodiment

Figure 16A:
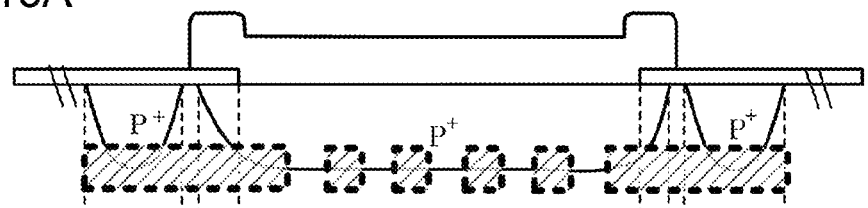
FIGS. 16A and 16B are tenth plan views of the low lifetime region according to the invention.
Figure 16B:
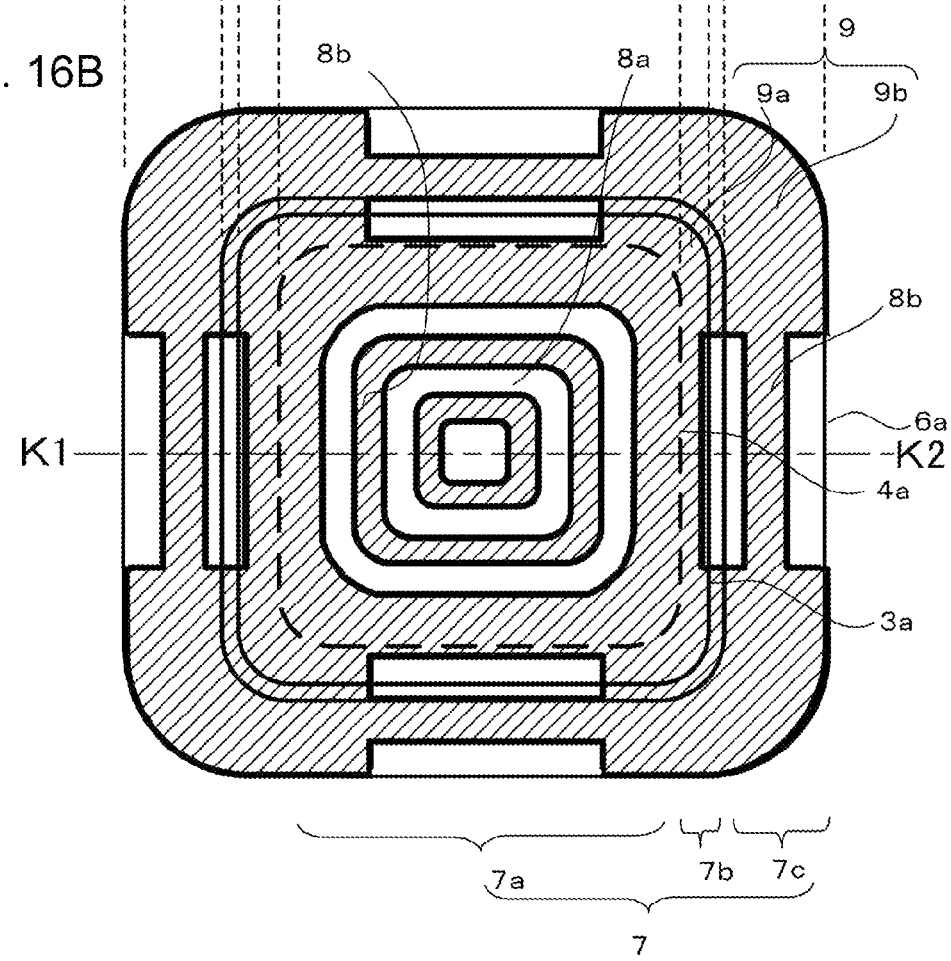

FIGS. 16A and 16B are an example of a planar pattern of the low lifetime region 7 of one chip of a diode formed on a semiconductor substrate according to a tenth embodiment of the invention. FIG. 16A is a main portion sectional view showing the diode p-type anode region 3 and the innermost region 6a of the guard rings 6 enclosing the outer periphery of the p-type anode region 3 at a predetermined even distance. FIG. 16B is a plan view seen from above the diode. The section of FIG. 16A is a sectional view when cutting along a K1-K2 line of FIG. 16B, and FIGS. 16A and 16B are drawn so that the distances in each on the main surface of the semiconductor substrate correspond to each other.

A difference from the seventh embodiment is that the low lifetime region pattern of the central region 7a is of a donut form, in the same way as in the fourth embodiment. Because of this, it is possible to reduce the leakage current without losing reverse recovery resistance, and furthermore, to achieve the same advantage as in the fourth embodiment.

Whatever form is adopted from the second to tenth embodiments, the ratio of the area of the hatched central region 7a (irradiated region) with respect to the whole area of a projection region portion of the portion coinciding with the p-type anode region 3 may be within a range of 20% to 80%. This area ratio corresponds to FIGS. 8 and 9.

Eleventh Embodiment

In an eleventh embodiment, a description will be given of the reason for the position of the expanded end portion region 7c of the low lifetime region 7 being the position of the innermost guide ring.

The invention is such that, when carrying out a helium ion irradiation on a semiconductor substrate, it is also possible to restrictively form a crystal defect region in a predetermined depth range determined depending on the acceleration energy when irradiating and/or the thickness of a depth regulating metal plate (a metal substrate of aluminum, molybdenum, or the like). The crystal defect region includes a recombination center that forms a lifetime killer, and has a function of shortening the electron-hole carrier lifetime more than in a non-irradiated region. By this kind of low lifetime region selectively formed in both the planar direction and depth direction of the semiconductor substrate being provided, a concentration of current in an outer peripheral side end portion of the $p^+$ type diffusion region 3 (anode region) and anode electrode 4 is suppressed when there is diode reverse recovery, without increasing a forward voltage drop VF (on-state voltage), because of which a diode with high di/dt resistance is obtained.

Furthermore, a configuration may be adopted wherein the helium ion irradiation region is expanded as far as the innermost $p^+$ type diffusion ring form region 6a of the specific $p^+$ type guard ring regions 6, but not provided on the exterior thereof. In this way, the diode according to the invention is characterized in that control is carried out so that it is possible, by adopting a configuration wherein the low lifetime region 7 is not provided on the exterior of the $p^+$ type diffusion ring form region 6a and by selectively providing a helium ion non-irradiation region inside the low lifetime region 7 too, to change the extent to which the in-plane elimination of carriers is accelerated according to place.

One reason the low lifetime region is not provided in the semiconductor substrate further to the outer peripheral side than the position of the innermost guard ring in the invention is that, provided that the low lifetime region is expanded from the anode region to the outer peripheral side so as to reach at least one guard ring, it is possible to shorten the lifetime of hole carriers that tend to concentrate in the vicinity of four corners having a curved region in an outer peripheral side termination portion of the anode region. By reducing the hole carriers in the vicinity of the corners, it is possible to suppress current concentration when there is reverse recovery. Also, another reason is that, by the low lifetime region being locally restricted rather than being provided over the whole of the semiconductor substrate, an increase in the forward voltage drop (VF), which is in a trade-off relationship, is suppressed.

Hereafter, a description will be given of a method for limiting the low lifetime region to 20% to 80% of the area of the active region with a single helium ion irradiation, as previously described. One reason for an all-over irradiation carried out in the low lifetime corner region and the amount of helium ion irradiation being greater than in other regions is in order to quickly eliminate carriers that concentrate in the low lifetime corner region from various directions when there is reverse recovery with the low lifetime region that is spread particularly widely in a corner peripheral region 9a and a corner expanded end portion region 9b of the low lifetime corner region 9, as a result of which, it is possible to prevent an increase in reverse recovery current in the low lifetime corner region 9. Also, another reason is in order to separate in terms of distance a region in which current concentration occurs in a spherical p-n junction plane at a corner portion termination of the anode region and a region in which current concentrates in a corner portion of the anode electrode in contact with the surface of the anode region. Because of this, the ratio of the helium ion irradiation area with respect to the whole area of the anode electrode may be reduced to a range of 20% or more, 80% or less, as described in Examples 1 to 3.

Twelfth Embodiment

In a twelfth embodiment, a description will be given of a method of manufacturing the diode of the invention.

In embodiments, the depth of a $p^+$ type diffusion region, that is, the position deepest from the surface of the p-n junction plane between an $n^-$ type semiconductor layer and the $p^+$ type diffusion region, may be formed within a range of 2 μm or more, 22 μm or less, from the surface of the $p^+$ type diffusion region. When fabricating a diode, firstly, methods of forming guard rings and an anode region are a method whereby the $p^+$ type diffusion region (anode region) and guard rings are formed with a single diffusion on the surface of the $n^-$ type semiconductor layer, and a method of forming with two diffusions, whereby the guard rings are deeper than the $p^+$ type diffusion region (anode region), and either can be selected. Next, a dielectric film and an anode electrode are formed. Next, a required helium ion screening photoresist mask is formed in the $p^+$ type diffusion region and a junction termination structure region on the semiconductor substrate, and furthermore, an aluminum helium ion depth regulating mask is placed as desired on the photoresist mask, and a helium ion irradiation is carried out, thereby introducing crystal defects into the crystal. Subsequently, heat treatment is carried out approximately at 350° C. in order to maintain the thermal stability of the induced crystal defects. By so doing, a lifetime killer is introduced, thereby forming a low lifetime region. As an example, an FZ wafer or an epitaxial wafer can be used as the semiconductor substrate.

As previously described, by the low lifetime region 7 being formed so as to include the peripheral region 7b from the anode electrode contact end 4a to the $p^+$ type outer peripheral end 3a, it is possible to reduce the carrier concentration in the vicinity of the anode electrode contact end 4a, and thus possible to suppress current concentration when there is reverse recovery. Consequently, this configuration may be used, as it is possible to further increase reverse recovery resistance and di/dt resistance.

According to the diode in the heretofore described examples, damage caused to the p-n junction by a helium ion irradiation decreases, and leakage current is reduced. Also, by the concentration of current at the p-n junction of the corner portions of the $p^+$ type diffusion region being alleviated, the amount of helium ion irradiation to the depth of the $p^+$ type diffusion region decreases, but the reverse recovery current resistance is maintained at the equivalent of that when a helium ion irradiation is carried out over the whole of the chip. According to the examples, it is possible to further improve both suppression of reverse recovery current and suppression of an increase in the forward voltage drop (VF) compared with a diode having a heretofore known low lifetime region.

According to the helium ion irradiation region according to the invention, it is possible to reduce hole carriers concentrated in the corner portions of the boundary portion between the p-type semiconductor region (anode region) and the junction termination structure region more effectively than in linear portions. Also, in the linear portions of the boundary portion between the p-type semiconductor region (anode region) and the junction termination structure region, the helium ion irradiation area may be of a configuration such as to be partially irradiated with helium ions. This is because the extent to which hole carriers concentrate is smaller in the linear portions than in the corner portions. By the linear portions being partially irradiated with helium ions, it is possible to reduce concern of an increase in forward voltage drop, in the same way as in the central region of the p-type semiconductor region (anode region). Furthermore, reducing damage to the p-n junction is also advantageous in reducing reverse leakage current.

While the present invention has been particularly shown and described with reference to certain specific embodiments, it will be understood by those skilled in the art that the foregoing and other changes in form and details can be made therein without departing from the spirit and scope of the present invention.

What is claimed is:

1. A semiconductor device, comprising:
   a first conductivity type semiconductor substrate;
   a second conductivity type semiconductor region having a planar pattern enclosed by four rectangular linear sides and four corner curved sides on one main surface of the semiconductor substrate;
   a metal electrode forming Ohmic contact with the surface of the second conductivity type semiconductor region;
   a junction termination structure region including a plurality of second conductivity type guard rings enclosing an outer periphery of the second conductivity type semiconductor region on a one main surface side; and
   a low lifetime region of a depth within a predetermined distance range sandwiching a p-n junction of a bottom portion of the second conductivity type semiconductor region on the one main surface side and another semiconductor substrate main surface side of the p-n junction, separated from the one main surface side, wherein the low lifetime region includes
   a central region that has a portion coinciding with the second conductivity type semiconductor region as seen from the one main surface side and is formed as far as a position of a contact end portion of a region of a coinciding portion with which the second conductivity type semiconductor region and metal electrode are in contact, the central region including a first region in which a lifetime of minority carriers is reduced and a second region which the lifetime of minority carriers is either not reduced or is less reduced compared to the first region, each of the first region and the second region being separated in a depth direction from the metal electrode and being arranged in an in-plane direction substantially transverse to the depth direction, the second region alternating with the first region in a same plane as the first region,
   a peripheral region wherein the central region extends as far as a position of an outer peripheral end of the second conductivity type semiconductor region, and
   an expanded end portion region wherein the peripheral region extends as far as an outer peripheral end of an innermost of the guard rings, and
   wherein the second region has a non-low lifetime region formed of a planar pattern of a plurality of stripe forms.

2. The semiconductor device according to claim 1, wherein
   an area of the coinciding portion of the central region is between 20% and 80% of the area of the second conductivity type semiconductor region.

3. The semiconductor device according to claim 1, wherein
   an aperture portion in the central region in which the low lifetime region is not formed is separated inwardly from the contact end portion.

4. The semiconductor device according to claim 1, wherein
   a corner portion of the aperture portion is curved.

5. The semiconductor device according to claim 1, wherein
   the low lifetime region has an edge aperture portion in which the low lifetime region is not formed in edges sandwiched by four corners of the central region and peripheral region.

6. The semiconductor device according to claim 5, wherein
   the edge aperture portion is disposed alternately with the central region and peripheral region along the edges.

7. The semiconductor device according to claim 6, wherein
   a width of the edge aperture portion along the edges sandwiched by the four corners is less than a width of the central region and peripheral region along the edges.

8. The semiconductor device according to claim 5, wherein
   a form of the edge aperture portion is a rectangle long in a direction along an edge.

9. The semiconductor device of claim 1,
   wherein the first region and the second region correspond respectively to irradiated portions and non-irradiated portions.

10. The semiconductor device of claim 9, wherein the peripheral region is overlapped by an end of the metal electrode as seen in a plan view.

11. The semiconductor device according to claim 1, wherein
    lifetime other than in the low lifetime region is longer than in the low lifetime region, and shorter than 10 µs.

12. The semiconductor device according to claim 1, wherein
    a light ion irradiation is a helium ion irradiation.

13. The semiconductor device according to claim 12, wherein
    a dose of the helium ion irradiation is $5 \times 10^{11}$ cm$^{-2}$ or less.

14. The semiconductor device according to claim 1, wherein
    a range of a depth direction of the low lifetime region is a range between 80% and 120% of a depth of the p-n junction.

15. The semiconductor device according to claim 1, wherein
    a width along the one main surface of the peripheral region is 200 µm or more.

16. The semiconductor device according to claim 1, wherein
    a width along the one main surface of the expanded end portion region is between 20 µm and 100 µm.

* * * * *